United States Patent
Paillet et al.

(10) Patent No.: US 6,737,924 B1
(45) Date of Patent: May 18, 2004

(54) DIFFERENTIAL, DOUBLE FEEDBACK CMOS TRANSIMPEDANCE AMPLIFIER WITH NOISE TOLERANCE

(75) Inventors: Fabrice Paillet, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/317,709

(22) Filed: Dec. 11, 2002

(51) Int. Cl.[7] .............................. H03F 3/08; H03F 3/18; H03F 3/26
(52) U.S. Cl. ..................... 330/308; 330/264; 330/271
(58) Field of Search ................... 330/308, 264, 330/271, 267

(56) References Cited

U.S. PATENT DOCUMENTS

| | | | | |
|---|---|---|---|---|
| RE31,749 E | * | 11/1984 | Yamashiro | ............... 330/264 |
| 5,745,010 A | * | 4/1998 | Miyamoto et al. | ........... 330/294 |
| 5,963,094 A | * | 10/1999 | Linder et al. | ................ 330/264 |
| 6,097,253 A | * | 8/2000 | Hissen | ........................ 330/277 |

* cited by examiner

Primary Examiner—Patricia Nguyen
(74) Attorney, Agent, or Firm—Seth Z. Kalson

(57) ABSTRACT

A transimpedance amplifier having a first input port to connect to a signal source having an output impedance, and a second input port loaded by an impedance matched to the output impedance of the signal source, the amplifier comprising three stage pairs. The first stage pair comprises two inverting amplifiers, each employing negative feedback. The second stage pair comprises two inverting amplifiers with cross-coupled negative feedback. The third stage pair is similar in structure to the first stage pair. The inverter amplifiers in the third stage pair provide the differential voltage.

10 Claims, 6 Drawing Sheets

US 6,737,924 B1

DIFFERENTIAL, DOUBLE FEEDBACK CMOS TRANSIMPEDANCE AMPLIFIER WITH NOISE TOLERANCE

FIELD

The present invention relates to analog circuits, and more particularly, to amplifiers.

BACKGROUND

With increasing data rates in electronic systems, it is expected that optical interconnects (optical fibers) may in the near future replace wire interconnects at the board-to-board and chip-to-chip level. For example, a computer system such as that illustrated in FIG. 1 may comprise one or more boards 102 and memory hierarchy 104 that exchange data packets over optical interconnects 106. These packets may be routed via switch 108, or perhaps the various integrated circuits may be directly connected to one another. In the example of FIG. 1, each board 102 comprises I/O circuit or board 110, and comprises one or more microprocessors, e.g., microprocessor 112, in communication with its corresponding I/O circuit.

An I/O circuit utilizes an optical transceiver, comprising an optical transmitter for up-converting an electrical signal to an optical signal, and an optical receiver for down-converting an optical signal to an electrical signal. An optical receiver usually comprises a photodetector to provide an electrical signal indicative of a received optical signal. A typical small-signal model for a photodetector is provided in FIG. 2, comprising small-signal current source 202 and parasitic capacitor 204. The small-signal current provided by current source 202 is representative of the received optical signal. The output current signal is provided at output port 206.

The output signal provided by the photodetector is amplified to a logical voltage level before utilized by a CDR (Clock and Data Recovery) circuit to recover both the original clock signal and the optically transferred data. A multi-stage amplifier is often employed to amplify the small signal output of the photodetector to a logical voltage level. The front end of the multi-stage amplifier usually a transimpedance amplifier. A transimpedance amplifier provides a small-signal output voltage signal in response to a small-signal input current signal. As one example, the output voltage signal of a transimpedance amplifier may have an amplitude in the range of 100 mV. Because this voltage swing is usually inadequate to drive a CDR circuit, further amplification is usually provided by a limiting and saturating post-amplifier.

Currently, high speed optical communication links involve data rates higher than 10 Gb/s (bits-per-second). The bandwidth of a transimpedance amplifier is typically chosen to be equal to about 0.7 times the bit-rate, which is a compromise between the total integrated noise and the intersymbol interference resulting from the limited bandwidth. For example, a 14 GHz bandwidth transimpedance amplifier may be desirable for a 20 Gb/s optical link. With such high data rates, the number of photons integrated in the photo detector during one clock cycle and the resulting number of electrons generated by the photodetector is relatively low. As a result, high gain, high bandwidth transimpedance amplifiers are desirable.

In addition, to reduce overall system cost, it is often desirable to integrate a transimpedance amplifier on the same die as a microprocessor, digital signal processor, or other digital circuit utilizing CMOS (Complementary Metal Oxide Semiconductor) technology. These digital circuits may introduce power supply and substrate noise. Because the input signals to transimpedance amplifiers are relatively small, the noise amplitude due to power supply and substrate coupling with the digital circuits may exceed that of the input signal. Consequently, there is a need for high gain, high bandwidth CMOS transimpedance amplifiers having good noise tolerance capabilities.

DESCRIPTION OF EMBODIMENTS

Figure 1:
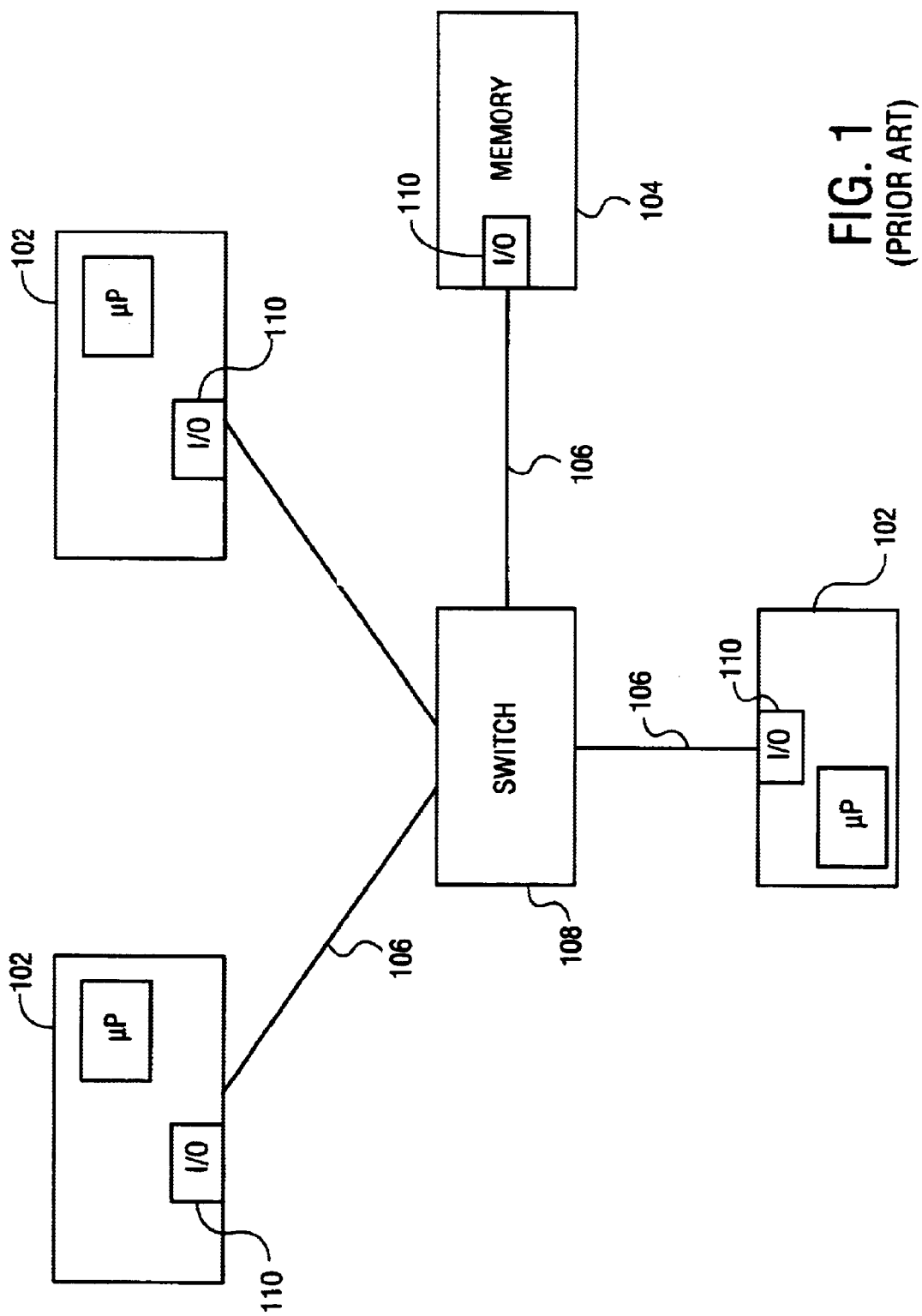
FIG. 1 is a high-level abstraction of a computer system utilizing optical signals and interconnects for board-to-board communication.
Figure 2:
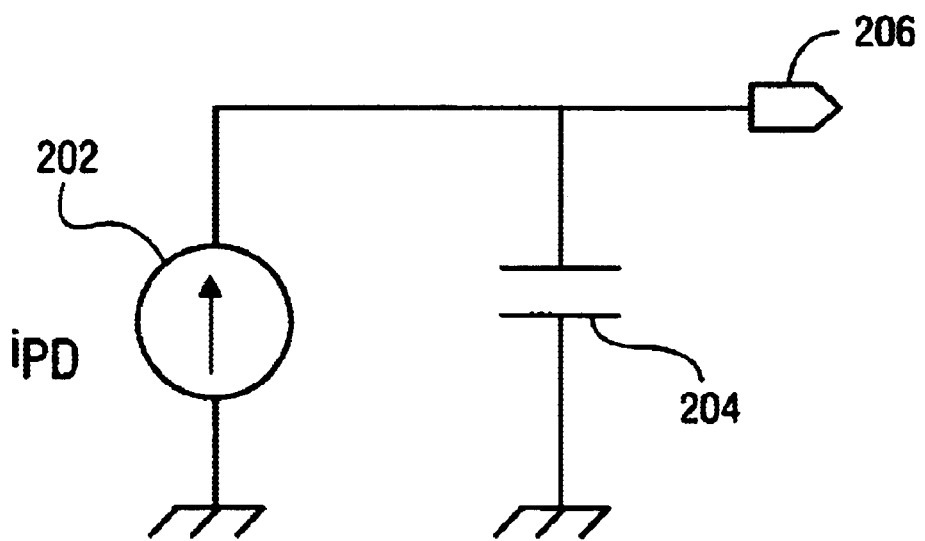
FIG. 2 is a simplified small-signal model of a photodetector.
Figure 3:
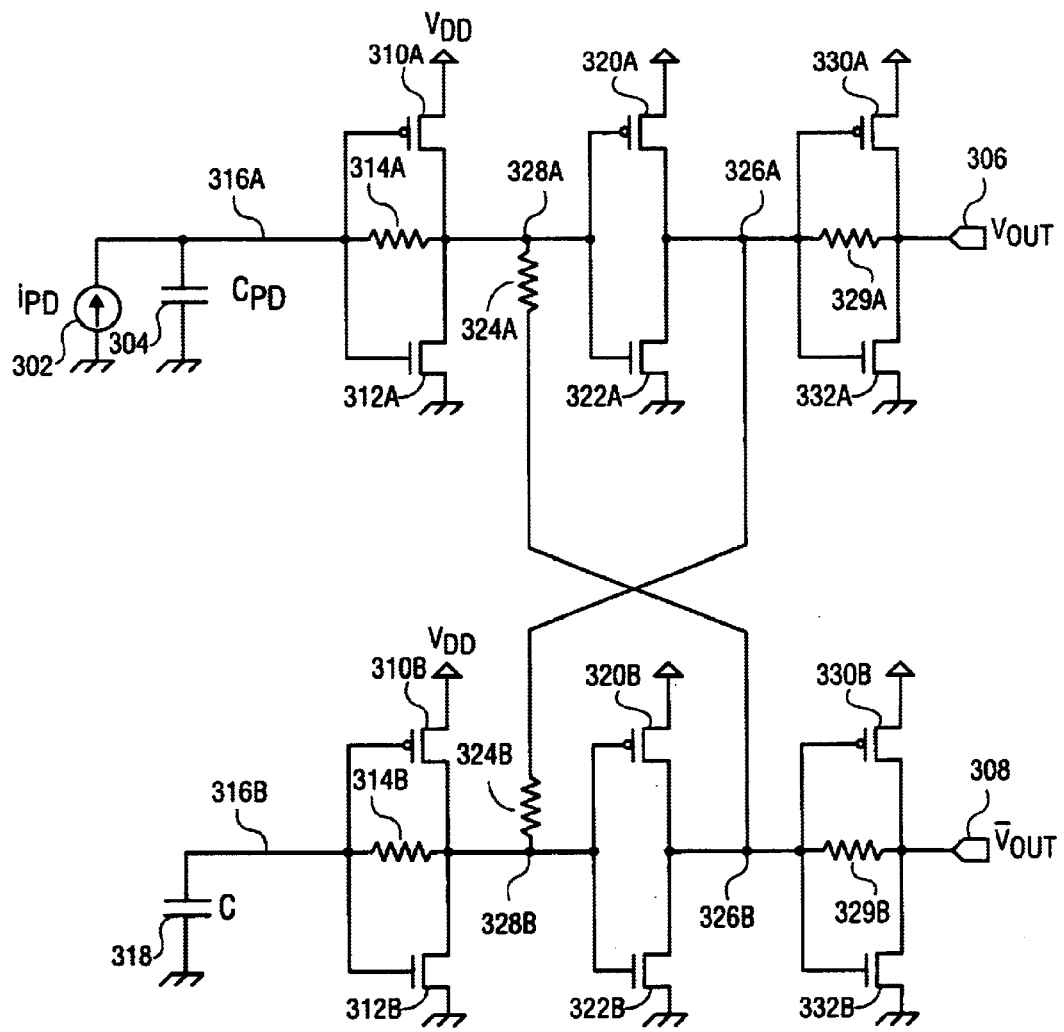
FIG. 3 is an embodiment of the present invention at the circuit level.

FIG. 3 shows an embodiment at the circuit level of an amplifier driven by a photodetector modeled as current source 302 and capacitor 304. The amplifier of FIG. 3 provides a differential output voltage $\{V_{OUT}, \overline{V}_{OUT}\}$ at output ports 306 and 308. Ideally, under noiseless conditions these voltages may be written as $V_{OUT}=v+V_0$ and $\overline{V}_{OUT}=-v+V_0$, where $v$ is a small-signal voltage and $V_0$ a voltage between ground and supply voltage $V_{DD}$. In some embodiments, $V_0=V_{DD}/2$. (If the two supply voltages are $V_{DD}$ and $V_{SS}$ rather than $V_{DD}$ and ground, then clearly $V_{DD}>V_0>V_{SS}$.) Ideally, the small-signal voltage $v$ is proportional to the small-signal photodetector current $i_{PD}$.

It is expected that noise due to power supply and substrate coupling will be equally present in both voltages $V_{OUT}$ and $\overline{V}_{OUT}$. The differential voltage $\{V_{OUT}, \overline{V}_{OUT}\}$ may be further amplified by differential post-amplifiers. Differencing the two components of the differential voltage $\{V_{OUT}, \overline{V}_{OUT}\}$, or differencing its differential amplification, subtracts out much of the noise. In this way, it is expected that the embodiment of FIG. 3 has utility in noisy environments.

The amplifier of FIG. 3 has three stage pairs. Each pair has two inverter amplifiers. The first pair of stages has a first inverter comprising pMOSFET 310a and nMOSFET 312a, and a second inverter comprising pMOSFET 310b and nMOSFET 312b. Resistor 314a provides negative feedback for the first inverter pMOSFET 310a and nMOSFET 312a, and resistor 314b provide negative feedback for the second inverter pMOSFET 310b and nMOSFET 312b. These inverter amplifiers are matched. That is, pMOSFETs 310a and 310b are matched to each other, i.e., they have the same betas, nMOSFETs 312a and 312b are matched to each other, and resistors 314a and 314b have the same resistance value.

Each of the inverter amplifiers with negative feedback in the first stage pair is seen to be a simple transimpedance amplifier, where under reasonable assumptions the low frequency transimpedance is the resistance of resistor 314a for the first inverter amplifier and 314b for the second inverter amplifier. These resistors also set the bias levels of the pMOSFETs and nMOSFETs in the first stage pair so that the inverter amplifiers operate in their linear high gain region, and resistor 314a also provides a current path for the photodetector.

The first inverter amplifier in the first stage pair has its input port 316a connected to the photodetector. However, input port 316b is connected to a capacitor 318 having the same capacitance as photodetector capacitor 304. More generally, input port 316b should be loaded by the same impedance as seen by input port 316a looking into the photodetector, or whatever source is driving the amplifier. (The present invention is not necessarily limited to amplifying a signal from a photodetector.)

The second (or middle) stage pair in the embodiment of FIG. 3 has two inverter amplifiers, the first inverter amplifier comprises pMOSFET 320a and nMOSFET 322a, and the second inverter amplifier comprises pMOSFET 320b and nMOSFET 322b. Resistor 324a provides feedback from output port 326a of the first inverter amplifier in the second stage pair to input port 328b of the second inverter amplifier in the second stage pair. Resistor 324b provides feedback from output port 326b of the second inverter amplifier in the second stage pair to input port 328a of the first inverter amplifier in the second stage pair. The first and second inverter amplifiers in the second stage pair are matched to each other, and the resistors 324a and 324b have the same resistance.

The third stage pair in the embodiment of FIG. 3 is identical in structure to the first stage pair. However, although resistors 329a and 329b are matched to each other, i.e., they have the same resistance, they need not necessarily have the same resistance as resistors 314a and 314b. Similarly, although pMOSFETs 330a and 330b are matched to each other, they are not necessarily matched to pMOSFETs 310a and 310b. A similar statement applies to nMOSFETs 332a and 332b.

Figure 4:
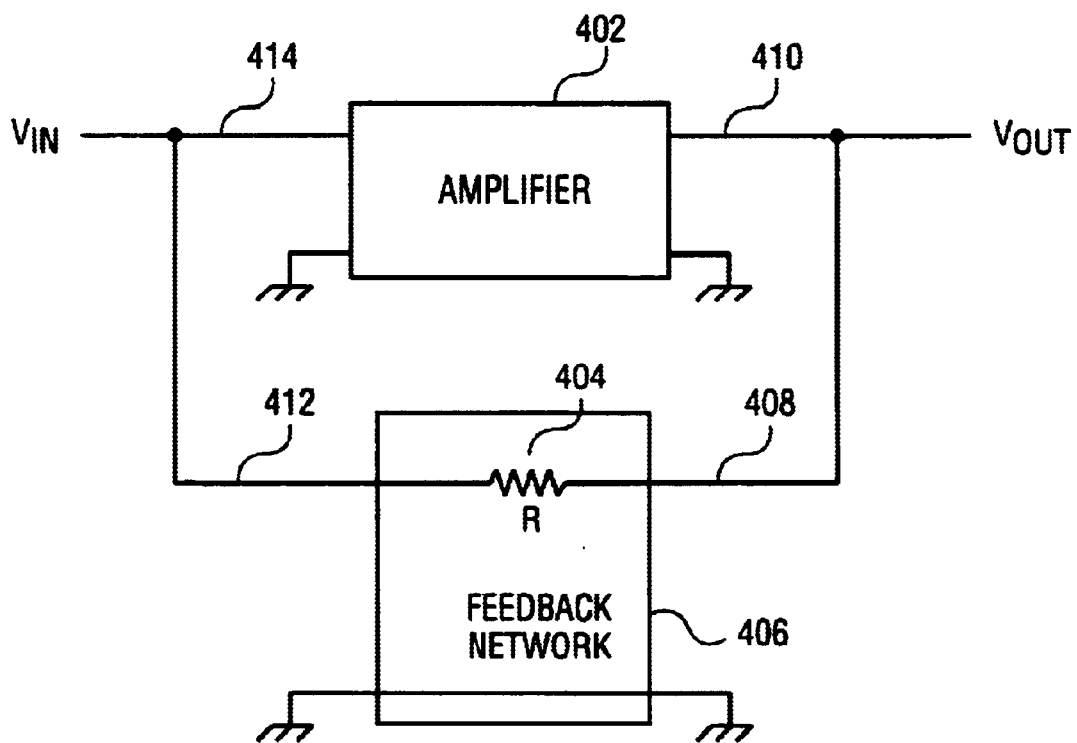
FIG. 4 abstracts the feedback topology of the shunt-shunt stages in embodiment of FIG. 3.

The feedback structure used in the inverter amplifiers in the first and last stage pairs in FIG. 3 may be abstracted as shown in FIG. 4. Amplifier block 402 is a voltage amplifier without feedback, for example, the circuit of a simple inverter. Resistor 404 is the feedback element. From FIG. 4, it is seen that the port of feedback network 406 comprising conductor 408 and ground is connected in shunt across the output port (conductor 412 and ground) of amplifier block 402, and the port of feedback network 406 comprising conductor 412 and ground is connected in shunt across the input port (conductor 414 and ground) of amplifier block 402. Accordingly, the inverters with negative feedback used in the first and second stage pairs of FIG. 3 may be referred to as shunt-shunt feedback amplifier stages.

By employing resistive cross coupling (resistors 324a and 324b) between the two inverter amplifiers in the second stage pair, the signal is complementary coupled while the resistive network helps to attenuate common noise. That is, the signal is coupled through resistive voltage dividers while the common noise is attenuated. (Resistors 314a and 324a form one of the voltage dividers, and resistors 314b and 324b form the other one.) The coupling intensity and common mode noise attenuation depend on the value of the resistors 324a and 324b relative to the feedback resistors 314a and 314b and the feedback resistors 329a and 329b. In one embodiment, the resistive values may be chosen as 200 Ω for resistors 314a and 314b, 100 Ω for resistors 324a and 324b, and 300 Ω for resistors 329a and 329b. These resistive values are meant to represent relative ratios of resistive values, so that the resistors may be scaled to maintain these relative ratios.

Figure 5:
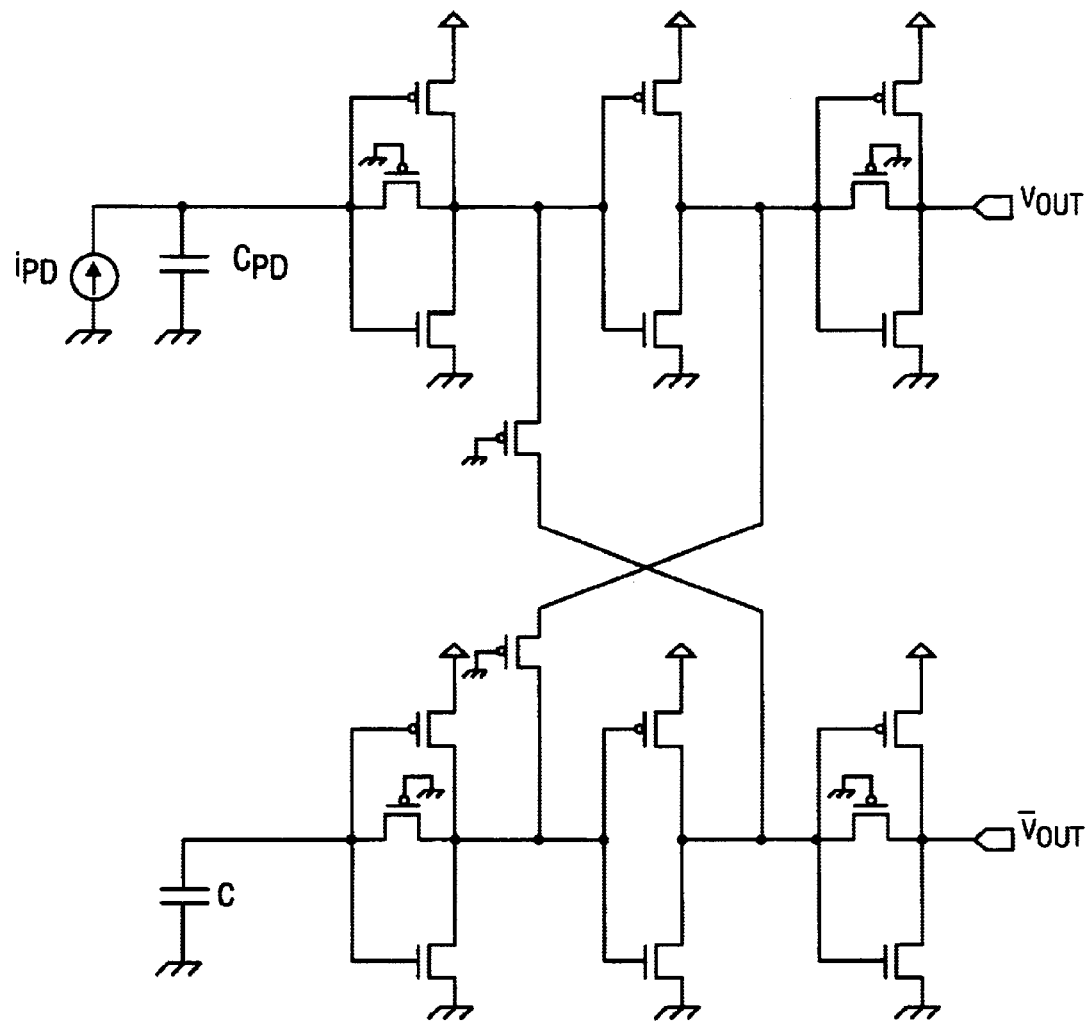
FIG. 5 is another embodiment of the present invention at the circuit level using transistors for feedback elements.

Various modifications may be made to the disclosed embodiments without departing from the scope of the invention as claimed below. For example, other resistive feedback elements may be used in place of the resistors in FIG. 3. As one example, pMOSFETs may be used. This is illustrated in the circuit of FIG. 5. In other embodiments, nMOSFETs may be used. Or various combinations of different resistive feedback elements may be used.

Figure 6:
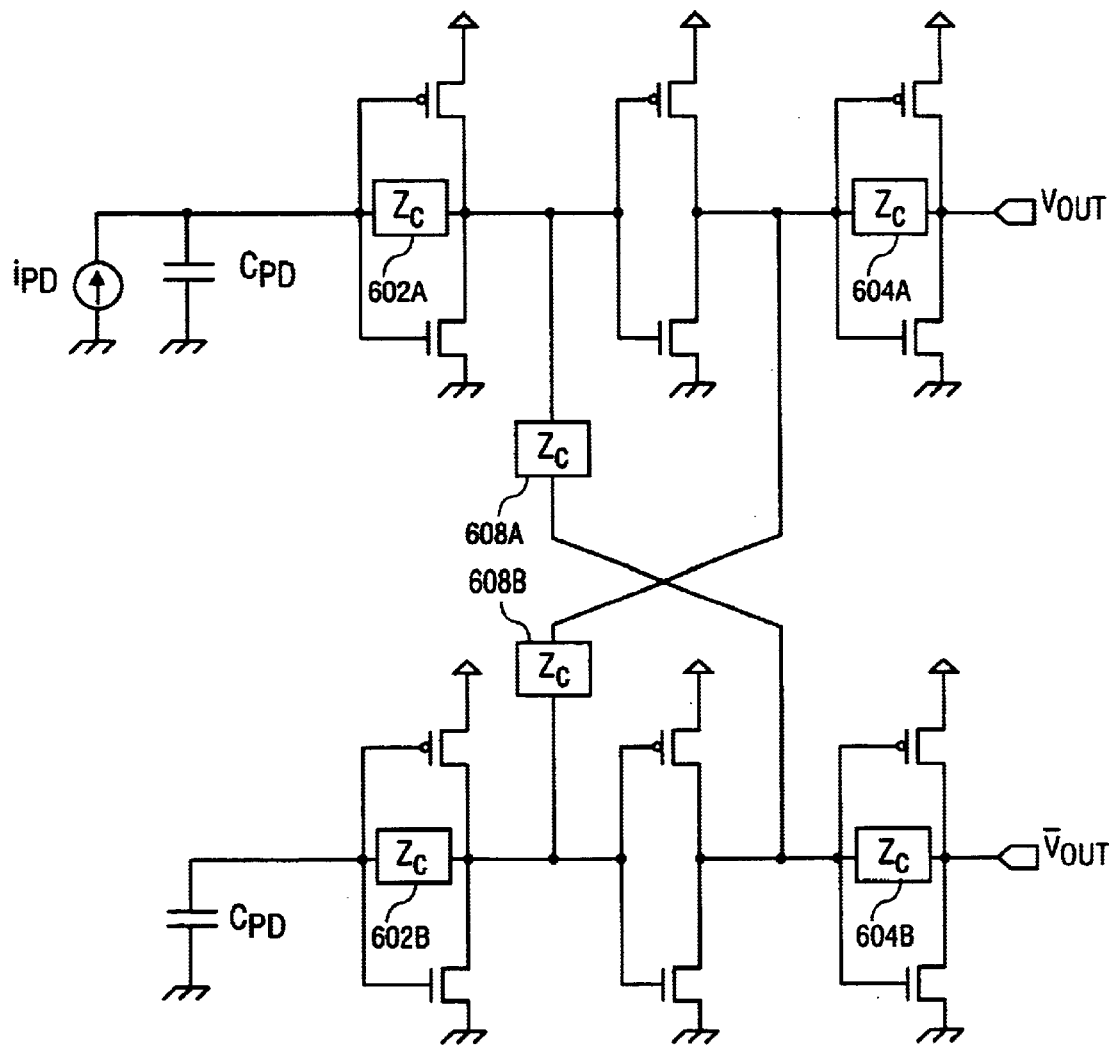
FIG. 6 is another embodiment of the present invention at the circuit level using complex impedances for feedback elements.

For other embodiments, feedback elements having a complex impedance may be used in the shunt-shunt stages. For example, the circuit of FIG. 3 may be generalized to the circuit of FIG. 6, where feedback elements 602a, 602b, 604a, 604b, 608a, and 608b in general have a complex impedance, with feedback elements 602a and 602b matched to each other, feedback elements 604a and 604b matched to each other, and feedback elements 608a and 608b matched to each other. As one example, some of these feedback elements may comprise a capacitor in parallel with a resistor to provide a larger stability margin. Other embodiments may use more stages. For example, additional shunt-shunt feedback stages may be added, with perhaps cross-coupled inverter amplifiers inserted between various shunt-shunt feedback stages.

What is claimed is:

1. An amplifier comprising:
   a first stage pair comprising first and second shunt-shunt feedback inverter amplifiers matched to each other;
   a second stage pair comprising first and second inverter amplifiers matched to each other, each inverter amplifier comprising an output port and an input port;
   a first feedback element coupling the output port of the first inverter amplifier to the input port of the second inverter amplifier;
   a second feedback element, matched to the first feedback element, coupling the output port of the second inverter amplifier to the input port of the first inverter amplifier; and
   a second stage pair comprising first and second shunt-shunt feedback inverter amplifiers matched to each other.

2. The amplifier as set forth in claim 1, wherein the first feedback element comprises a resistor.

3. The amplifier as set forth in claim 1, wherein the second feedback element comprises a resistor.

4. A die comprising:
   a current source having an output impedance;
   a transimpedance amplifier comprising a first input port connected to the current source and a second input port connected to a load having an impedance substantially equal to the output impedance of the current source, the transimpedance amplifier further comprising:
   a first stage pair comprising first and second shunt-shunt feedback inverter amplifiers matched to each other, the first shunt-shunt feedback inverter comprising a pMOSFET comprising a gate connected to the first input port and a nMOSFET comprising a gate connected to the first input port, and the second shunt-shunt feedback inverter comprising a pMOSFET comprising a gate connected to the second input port and a nMOSFET comprising a gate connected to the second input port;
   a second stage pair comprising first and second inverter amplifiers matched to each other, each inverter amplifier comprising an output port and an input port;
   a first feedback element coupling the output port of the first inverter amplifier to the input port of the second inverter amplifier;

a second feedback element, matched to the first feedback element, coupling the output port of the second inverter amplifier to the input port of the first inverter amplifier; and a second stage pair comprising first and second shunt-shunt feedback inverter amplifiers matched to each other.

5. The die as set forth in claim 4, wherein the first feedback element comprises a resistor.

6. The die as set forth in claim 4, wherein the second feedback element comprises a resistor.

7. The die as set forth in claim 4, wherein the current source comprises a photodetector having a capacitive output impedance, and wherein the load comprises a capacitor.

8. An amplifier comprising:

first and second input ports;

a first pMOSFET comprising a gate connected to the first input port and comprising a drain;

a first nMOSFET comprising a gate and a drain connected, respectively, to the gate and the drain of the first pMOSFET;

a first feedback element comprising first and second terminals connected, respectively, to the drain and the gate of the first pMOSFET;

a second pMOSFET comprising a gate connected to the second input port and comprising a drain;

a second nMOSFET comprising a gate and a drain connected, respectively, to the gate and the drain of the second pMOSFET;

a second feedback element comprising first and second terminals connected, respectively, to the drain and the gate of the second pMOSFET;

a third pMOSFET comprising a gate connected to the drain of the first pMOSFET and comprising a drain;

a third nMOSFET comprising a gate and a drain connected, respectively, to the gate and the drain of the third pMOSFET;

a fourth pMOSFET comprising a gate connected to the drain of the second pMOSFET and comprising a drain;

a fourth nMOSFET comprising a gate and a drain connected, respectively, to the gate and the drain of the fourth pMOSFET;

a third feedback element comprising a first terminal connected to the gate of the third pMOSFET and a second terminal connected to the drain of the fourth pMOSFET;

a fourth feedback element comprising a first terminal connected to the gate of the fourth pMOSFET and a second terminal connected to the drain of the third pMOSFET;

a fifth pMOSFET comprising a gate connected to the drain of the third pMOSFET and comprising a drain;

a fifth nMOSFET comprising a gate and a drain connected, respectively, to the gate and the drain of the fifth pMOSFET;

a fifth feedback element comprising first and second terminals connected, respectively, to the drain and the gate of the fifth pMOSFET;

a sixth pMOSFET comprising a gate connected to the drain of the fourth pMOSFET and comprising a drain;

a sixth nMOSFET comprising a gate and a drain connected, respectively, to the gate and the drain of the sixth pMOSFET;

a sixth feedback element comprising first and second terminals connected, respectively, to the drain and the gate of the sixth pMOSFET;

wherein the first and second pMOSFETs are matched to each other; the first and second nMOSFETs are matched to each other; the first and second feedback elements are matched to each other; the third and fourth pMOSFETs are matched to each other; the third and fourth nMOSFETs are matched to each other; the third and fourth feedback elements are matched to each other; the fifth and sixth pMOSFETs are matched to each other; the fifth and sixth nMOSFETs are matched to each other; and the fifth and sixth feedback elements are matched to each other.

9. The amplifier as set forth in claim 8, wherein each feedback element is a resistor.

10. A computer system comprising:

a photodetector comprising an output port and having an output impedance; and an amplifier comprising a first input port coupled to the output port of the photodetector, and a second input port coupled to a load having an impedance matched to the output impedance of the photodetector; the amplifier further comprising:

a first stage pair comprising first and second shunt-shunt feedback inverter amplifiers matched to each other;

a second stage pair comprising first and second inverter amplifiers matched to each other, each inverter amplifier comprising an output port and an input port;

a first feedback element coupling the output port of the first inverter amplifier to the input port of the second inverter amplifier;

a second feedback element, matched to the first feedback element, coupling the output port of the second inverter amplifier to the input port of the first inverter amplifier; and a second stage pair comprising first and second shunt-shunt feedback inverter amplifiers matched to each other.

* * * * *